(12) United States Patent
Sanasi et al.

(10) Patent No.: US 10,678,283 B2
(45) Date of Patent: Jun. 9, 2020

(54) VOLTAGE COMPENSATION CIRCUIT INCLUDING LOW DROPOUT REGULATORS AND OPERATION METHOD THEREOF

(71) Applicant: SK hynix Inc., Icheon-si Gyeonggi-do (KR)

(72) Inventors: Alessandro Sanasi, Monza and Brianza (IT); Herve' Caracciolo, Monza and Brianza (IT)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 96 days.

(21) Appl. No.: 15/173,189

(22) Filed: Jun. 3, 2016

(65) Prior Publication Data

US 2016/0357205 A1     Dec. 8, 2016

(30) Foreign Application Priority Data

Jun. 3, 2015  (IT) .................. 102015000020145

(51) Int. Cl.
*G05F 1/575*     (2006.01)
*G11C 5/14*      (2006.01)

(52) U.S. Cl.
CPC ............ *G05F 1/575* (2013.01); *G11C 5/147* (2013.01)

(58) Field of Classification Search
CPC ... G05F 1/46; G05F 1/56; G05F 1/565; G05F 1/567; G05F 1/575; G11C 5/147
(Continued)

(56) References Cited

U.S. PATENT DOCUMENTS 5,384,696 A * 1/1995 Moran ............... H02J 3/01
                                                 323/207
2006/0267562 A1* 11/2006 Szepesi ............ G05F 1/577
                                                 323/224
(Continued)

FOREIGN PATENT DOCUMENTS

CN    103885517 A    6/2014
EP      1653315 A1   5/2006

OTHER PUBLICATIONS

Norbert Wolff, "Rapporto Di Ricerca," Jan. 26, 2016, pp. 1-7.

*Primary Examiner* — Nguyen Tran
*Assistant Examiner* — Monica Mata
(74) *Attorney, Agent, or Firm* — William Park & Associates Ltd.

(57) ABSTRACT

A method of recovering a voltage drop at an output terminal of a voltage compensation circuit connected to a load including a variable load current according to a condition of the load. A circuit portion for a regulator having an output terminal connected to a load including a variable load current may be provided. The circuit portion may include a plurality of stages connected in parallel to said output terminal. Each of said stages may be configured as a current driver having an output connected to the output terminal of said regulator. The circuit portion may include a comparator in each of said stages configured for receiving from a first input a reference voltage value and a predetermined threshold voltage from an other input. Each of said stages may receive a corresponding different threshold voltage value on said other input. The threshold voltage values may be correlated to the variable load current. At least a group of said stages may be sequentially enabled by each correspond- (Continued)

ing comparator to drive an extra current on said output terminal according to the amount of load current required by the load.

7 Claims, 7 Drawing Sheets

(58) Field of Classification Search
USPC .......................................................... 323/280
See application file for complete search history.

(56) References Cited

U.S. PATENT DOCUMENTS

| | | | | |
|---|---|---|---|---|
| 2008/0137444 | A1* | 6/2008 | Mair | G11C 5/143 365/189.07 |
| 2008/0258697 | A1* | 10/2008 | Gehrke | H02M 3/1588 323/283 |
| 2010/0259518 | A1* | 10/2010 | Smith | G05F 1/46 345/205 |
| 2012/0313665 | A1* | 12/2012 | Ochoa | G05F 1/613 326/104 |
| 2014/0268909 | A1* | 9/2014 | Digiacomo | H02M 3/33553 363/21.04 |
| 2015/0188408 | A1* | 7/2015 | Huang | H02M 1/088 323/272 |
| 2016/0155512 | A1* | 6/2016 | Ogawa | G11C 7/1039 365/185.03 |

* cited by examiner

VOLTAGE COMPENSATION CIRCUIT INCLUDING LOW DROPOUT REGULATORS AND OPERATION METHOD THEREOF

CROSS-REFERENCE TO RELATED APPLICATION

This application claims priority based upon Italian patent application No. 102015000020145, filed on Jun. 3, 2015, the disclosure of which is hereby incorporated in its entirety by reference herein.

BACKGROUND

1. Technical Field

Embodiments may generally relate to a circuit portion for low dropout regulators. More particularly, but not exclusively, the embodiments may relate to a circuit portion coupled to a voltage regulator allowing such a regulator to enhance its speed and recovery from a voltage drop on its output. The disclosure may report a possible application for voltage regulators in memory devices with the only purpose of simplifying a description.

2. Related Art

As it is well known in this specific technical field, a low-dropout or LDO regulator is a direct current DC linear voltage regulator which can regulate the output voltage even when its supply voltage is very close to the output voltage. The advantages of a low dropout voltage regulator over other DC to DC regulators include a lower switching noise, a smaller device size, and greater design simplicity, etc.

Inside memory devices there are many voltage regulators, each one provided for a specific regulation purpose. Those regulators are however employed in many other electronic devices wherein a voltage output must be regulated with a certain precision and stability.

FIG. 1 schematically illustrates a circuit diagram of a conventional LDO regulator. The LDO regulator 100 comprises a comparator 10, a PMOS power transistor PM, connected to the output of the comparator 10, a first resistor $R_1$ and a second resistor $R_2$ serially connected between the output of the regulator and a ground voltage reference VSSI. The comparator 10 receives a reference voltage VCCI_REF at its positive input (+) and a feedback voltage FEED at its inverting input (−) and outputs an output voltage DVRP. The feedback voltage FEED is a voltage at a node A between the first resistor $R_1$ and the second resistor $R_2$. The gate of the PMOS transistor PM is coupled with the output terminal of the comparator 10. The source of the PMOS transistor PM is coupled to the power voltage PWR. The drain of the PMOS transistor PM is coupled with one terminal of the first resistor $R_1$ and represents the output node OUT of the regulator 100 to be coupled to a load.

As can be appreciated by the previous description, the conventional LDO regulator 100 adopts a negative feedback network to stabilize the output voltage VOUT.

FIG. 2 illustrates a schematic view of a typical working scheme of a LDO regulator used in a memory device, for instance to regulate the programming voltage of the memory cells; the memory matrix is schematically indicated like a current generator $G_1$ connected in parallel to a filter capacitance $C_1$ having a relative high value. When reading or programming the memory cells a high amount of current is suddenly discharged to the load and an important voltage drop is generated in the output voltage VOUT at the output node OUT of the voltage regulator, as illustrated in FIG. 3. The vertical axis represents voltage levels of the output voltage VOUT (i.e., V1, V2, and V3,) and t represents time for the horizontal axis. The voltage drop is variable according for instance to the distance of the memory cell to be programmed from the terminals of the corresponding bit line and word line so that the resistive load to reach each cell is different.

So, a main voltage drop is due to the current peak requested for the programming phase while a reduced voltage drop is still present during a reading phase as illustrated in FIG. 3 by the dotted curve.

The drop of the output voltage VOUT causes a corresponding drop of the feedback voltage FEED that becomes smaller thus reducing the gain of the comparator and reducing the output voltage DVRP that controls the gate terminal of the power PMOS transistor PM. Therefore, the feedback voltage FEED is the method used by the known prior art solution to solve the problem of the fast recovery of the voltage output in LDO regulators. Late recovery Δt of the regulator's output voltage may cause a critical malfunction to the memory device.

However, the negative feedback network used to stabilize the output voltage VOUT would require also a power PMOS transistor PM having a great width/length W/L ratio to feed the required current peak. A big power transistor as an output driver involves a larger circuit area, higher costs and a higher consumption. Moreover, a big power transistor is associated to a compensation capacitance $C_2$ between the gate and drain terminals and this reduces the recovery speed of the whole regulator if the compensation capacitance shall be designed with a certain high dimension and area consumption.

On the contrary, a sudden drop of the output voltage VOUT should be recovered as fast as possible because the memory devices of cutting edge technology operate in a quite high bandwidth.

Therefore, the standard LDO regulators require a long time response to recover a voltage drop on their outputs and if this time response must be shortened then the LDO must be structured for a higher consumption or a possible compensation of the parasitic capacitance effects.

SUMMARY

In accordance with an embodiment, a voltage compensation circuit may be provided. The voltage compensation circuit may be for a regulator having an output terminal connected to a load including a variable load current according to different working conditions. The circuit portion may include a plurality of stages connected in parallel to said output terminal. Each of said stages may be structured as a current driver having an output connected to the output terminal of said regulator. The voltage compensation circuit may include a comparator in each of said stages receiving from a first input a reference voltage value and a predetermined threshold voltage from the other input. Each of said stages may receive a corresponding different threshold voltage value on said other input, and the threshold voltage values being correlated to the different working condition of the load. The voltage compensation circuit may include at least a group of said stages being sequentially enabled by each corresponding comparator to drive an extra current on said output terminal according to the amount of load current required by the load.

In accordance with an embodiment, a method of recovering a voltage drop may be provided. The method of recovering a voltage drop may be at an output terminal of a regulator connected to a load requiring a variable load current according to different working conditions of said load. The method may include providing a plurality of stages connected in parallel connected to the output terminal of said regulator. Each of said stages may be configured as a current driver enabled by a corresponding comparator receiving from a first input a reference voltage value and a predetermined threshold voltage from an other input. The method may include applying a corresponding different threshold voltage value to each other input of the comparators of said plurality of stages. The method may include enabling the driving of an extra current on said output terminal according to the amount of load current required by the load according to the different threshold voltage values applied to said comparators.

FIGS. from 7 to 10 illustrate the high speed circuit portion in different operating conditions according to an embodiment of the present disclosure.

Figure 11:
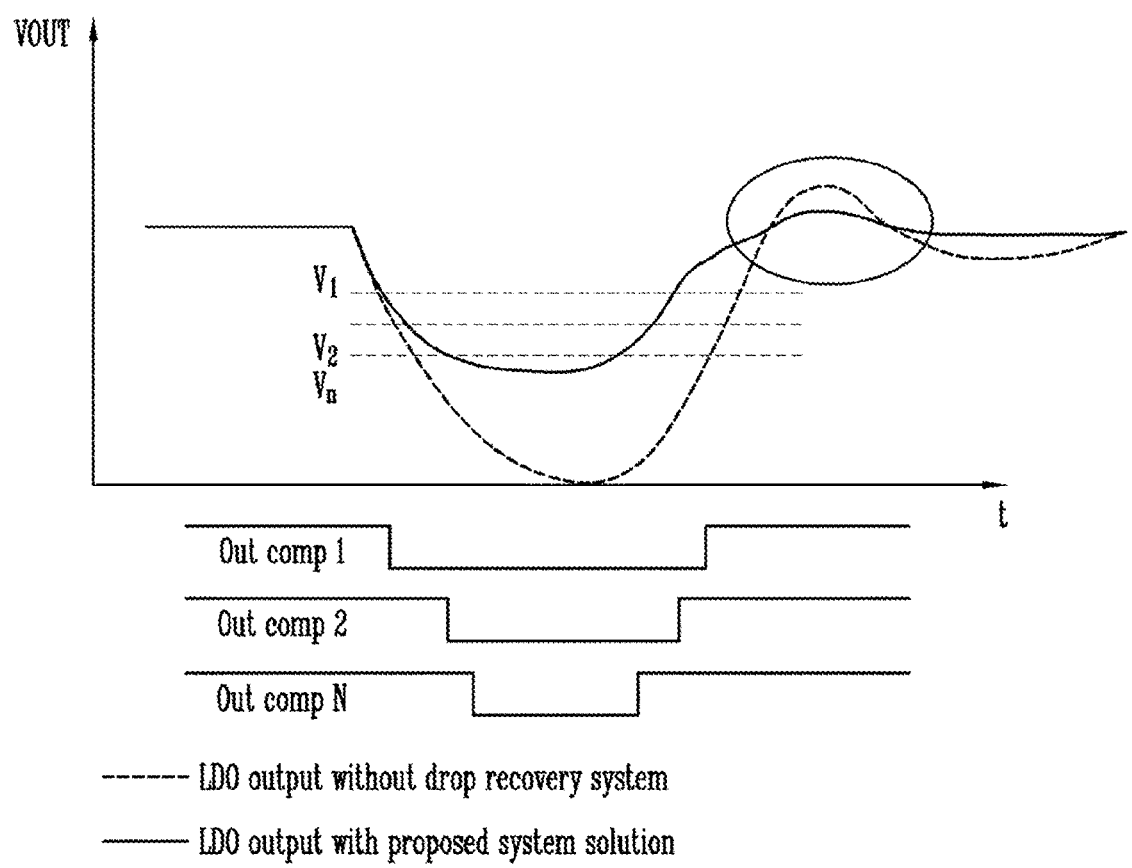

FIG. 11 is a comparative diagram illustrating the better performances of the high speed circuit portion of an embodiment. These illustrated performances can be compared with respect to the solution of the known art (not illustrated) when an output voltage drop affects the output terminal of a LDO regulator.

Figure 12:
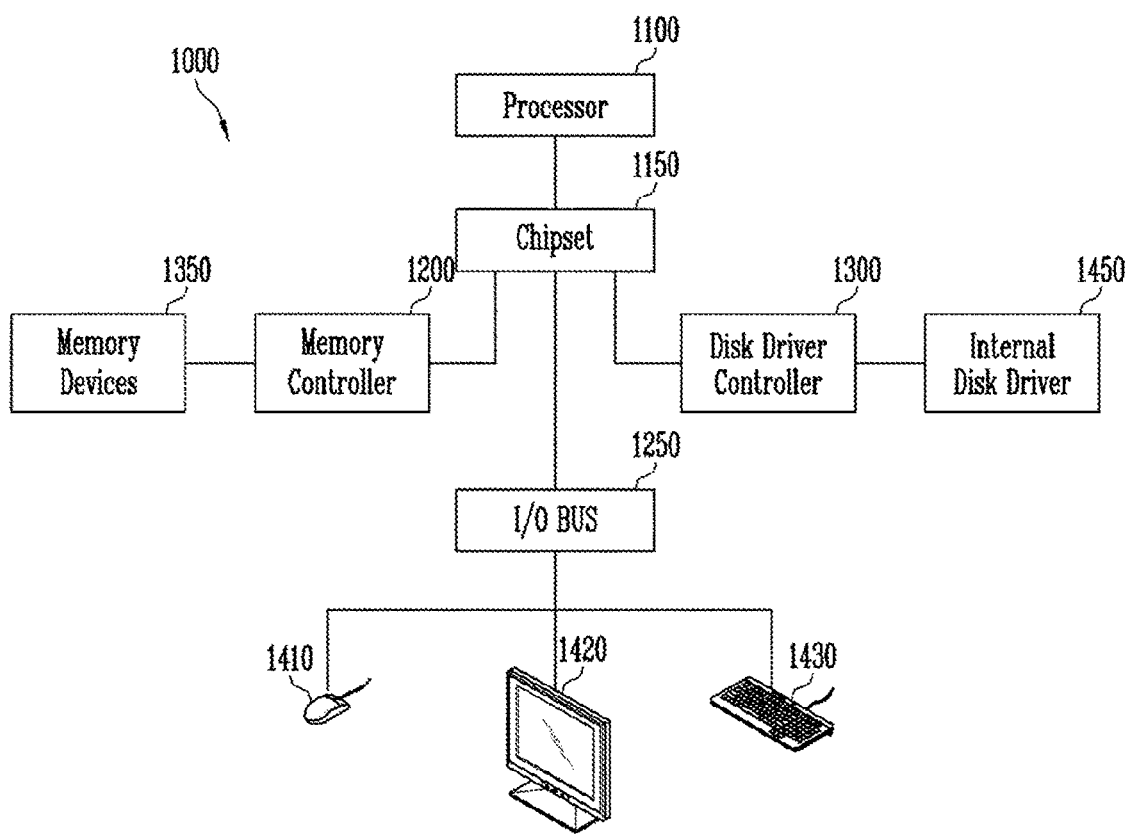

FIG. 12 illustrates a block diagram of an example of a representation of a system employing a circuit portion device and/or method with the various embodiments discussed above.

DETAILED DESCRIPTION

In view of the above mentioned limits of the prior art solutions it may be needed to devise a novel and inventive structure of a LDO regulator capable of operating with high slew rate without much current consumption.

Embodiments may be directed to a circuit portion for low dropout regulators having structural and functional capabilities to improve the slew rate and the bandwidth of the regulator associated to such a circuit portion.

In an embodiment, the current and power consumption during the recovery of the output voltage may be reduced.

An embodiment may allow for the standard regulator speed response to increase using a parallel system without feedback. The topologic peak drops may be compensated in function of the different operations and address by an optimum number of current branches added at the output terminal of the regulator.

Each current branch may introduce a cascade structure to limit the voltage overshoot. Moreover, the voltage bias of the cascade structure may be independent from power supply and output voltage.

Various embodiments may reduce the standard regulator bandwidth and power consumption allowing the required speed response. Moreover, it may require a small filter caps to reduce die size in memory device.

The characteristics and advantages of a circuit portion and of a method will be apparent from the following description of embodiments thereof given by way of indicative and non limiting examples with reference to the annexed drawings.

Figure 4:
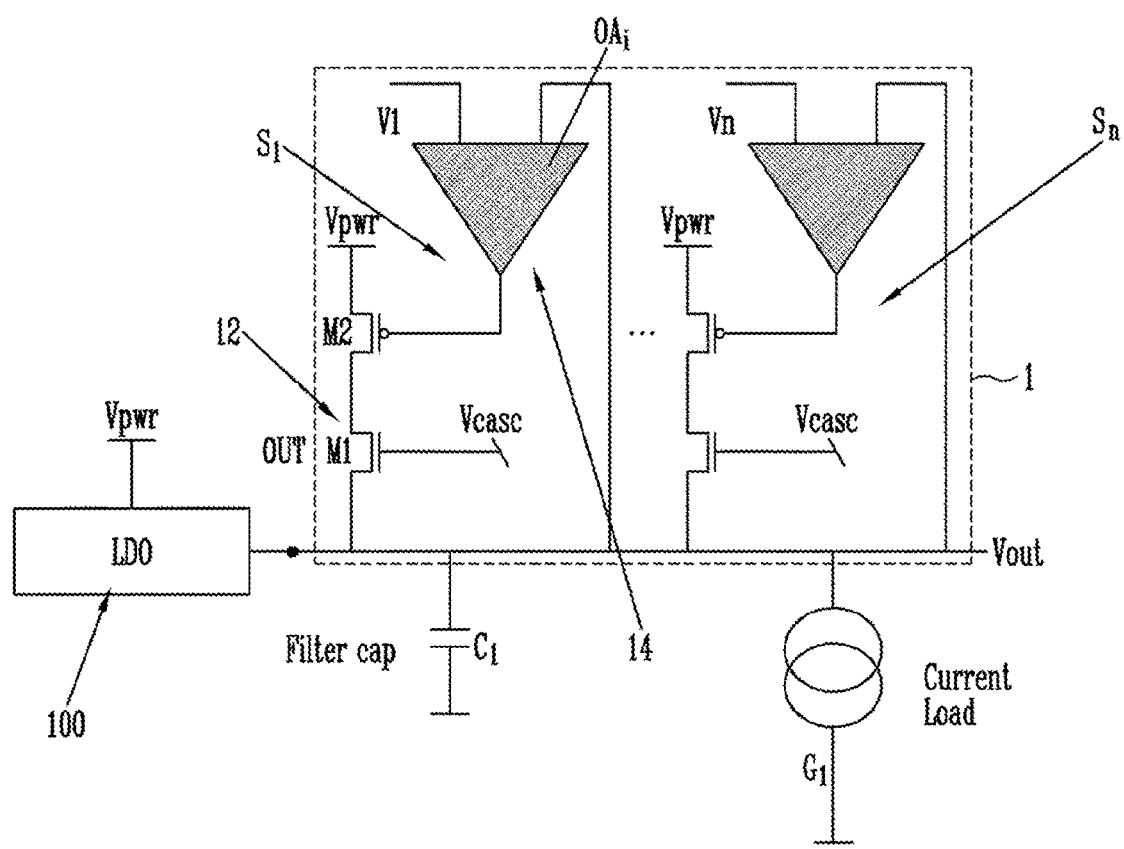
FIG. 4 schematically illustrates a circuit diagram of the high speed circuit portion associated with a LDO regulator according to an embodiment of the present disclosure.

With reference to FIG. 4, a high speed circuit portion for a low dropout (LDO) regulator 100 is illustrated.

The circuit portion 1 is connected to the output of the regulator 100 to improve according to an embodiment the recovery time after a voltage drop due to a high current amount suddenly requested by the load connected to the regulator output.

The load may be a memory matrix or a peripheral circuit portion of a memory device. However, the principle of an embodiment may be applied to any kind of voltage regulator having the need to recover a voltage drop at its output terminal.

The examples hereinafter disclosed with reference to an IC memory device is given just to simplify the understanding of the embodiments.

Moreover, it will be apparent to those skilled in the art that various modifications can be made without departing from the spirit and scope of the disclosure. The terms and words used in the specification and claims should not be construed as their ordinary or dictionary sense. Detailed descriptions of constructions well known in the art may be omitted to avoid unnecessarily obscuring the gist of the present disclosure.

The high speed circuit portion 1 includes a group of n compensation stages $S_1, S_2 \ldots S_n$ connected in parallel one to the other at the output terminal of the low dropout (LDO) regulator 100.

The main difference with the prior art solutions is given by the fact that the embodiments do not make use of feedback network but a parallel system that automatically adds a further compensation stage according to the amount of the voltage drop at the output node of the LDO regulator.

Each compensation stage $S_1, S_2 \ldots$ or $S_n$ may be considered a current driver sequentially enabled by a comparator $OA_i$ having a predetermined threshold voltage.

The output of each current driver is connected to the output terminal of the LDO regulator. In this manner each one of the stages $S_1, S_2 \ldots$ or $S_n$ offers a contribution to the amount of current required by the load thus reducing accordingly the voltage drop at the regulator output OUT.

The stages $S_1, S_2 \ldots$ or $S_n$ are independent from one another, but are substantially modular and structurally identical.

The threshold voltages to be supplied to one input of each comparator included in each corresponding stage are obtained at the outputs of a Digital-to-Analog D2A converter (not illustrated) that is managed by algorithms taking in consideration the different operations performed on the memory device wherein the LDO are incorporated.

For example, if the programming phase of the memory cells incorporated into the memory device are performed, then a corresponding amount of load current is expected and a corresponding number of current driver stages should be connected to the output terminal of the LDO regulator. Therefore, according to an embodiment, certain values of threshold voltages are generated by the D2A converter and those voltage values $V_1, V_2 \ldots$ or $V_n$ are applied to one input of the comparators of the n current driver stages $S_1, S_2 \ldots$ or $S_n$ to enable a number i of stages (i≤n) suitable to supply the requested amount of load current.

Those voltage values $V_1, V_2 \ldots$ or $V_n$ may depend from the action to be performed on the memory device but also from the location of the cell interested to such an action, and more particularly from the distance of that cell to the terminals of the corresponding bit line or word line. For each cell or group of cells it is possible to know in advance the voltage drop and a look-up table may be used to store in advance the correspondences between operations to be performed and location of the cells taking also in due consideration the process parameters and the temperature drift.

Figure 5:
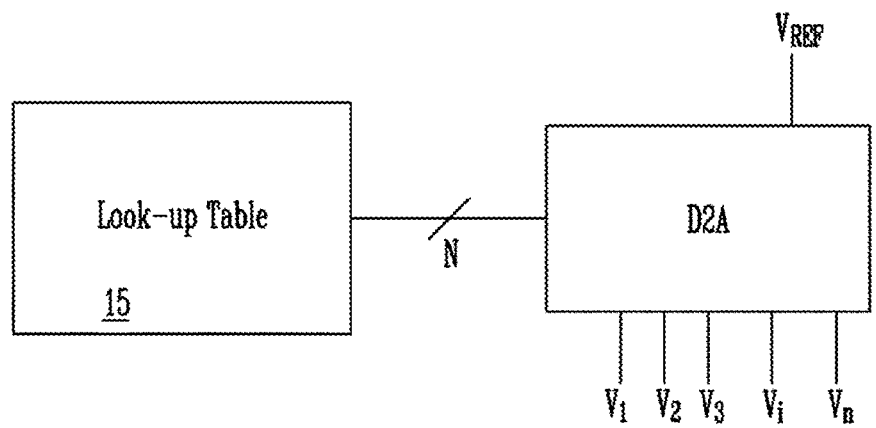
FIG. 5 schematically illustrates an example of a Digital-to-Analog converter block that is used to select voltages supplied to the high speed circuit portion of FIG. 4.

Referring to FIG. 5 the basic structure of the Digital-to-Analog D2A converter is illustrated. As may be appreciated the selection of the generated or converted voltages is obtained by the N digital output values of a look-up table 15 that stores a map of all possible combinations of operating situations wherein certain reading, erasing or programming phases of the memory device correspond a request of load current by the memory cells or the associated circuitry of the memory device.

As already mentioned the request of load current may depend also from the more or less remote location of the memory cells interested by the operating action. The resistive load of a bit line or a word line depends on the distance of the single cell to be read or programmed with respect to the terminals of the memory matrix. The longer the distance, the higher the resistive load could be and the request of load current to perform for instance a reliable programming operation.

Therefore, the look-up table 15 includes digital information taking in due count all possible reading, erasing or programming situations and provides at its output terminals N different digital values that are converted by the D2A block in a corresponding group of voltage values with respect to a single supply voltage VREF.

The values mapped into the look-up table 15 take into account the possible operating conditions such as a temperature drift during the functioning of the memory device. Moreover, it's possible to trim by look-up table the circuit features, to adapt the current drivability in order to keep the voltage performance.

It should also be noted that the capacity C1 connected to the output terminal of the LDO regulator has been selected in a range suitable for an output current drawn by the load of about 100 µA to optimize the circuit area of the load, i.e. the memory device.

Coming back to the structure of each compensation stage $S_i$, it should be noted that basic structure of each stage includes a first circuit portion 12 comprising an overshoot prevent circuit of MOS transistors and a second circuit portion 14 comprising an comparator $OA_i$.

The upper side of said overshoot prevent circuit 12 is a PMOS transistor M2 having the source terminal connected to a reference voltage node VPWR and the drain terminal serially linked to the drain terminal of an NMOS transistor M1.

The source terminal of the low side NMOS transistor M1 is connected to the output terminal OUT of the LDO regulator 100. Moreover, the NMOS transistor M1 is configured as a diode in a cascade configuration.

The serial connection of the upper and lower transistors M2, M1 may be considered equivalent to an upper current generator connected to a lower switch.

On the other circuit portion 14 the comparator $OA_i$ has a first input terminal receiving a predetermined threshold voltage $V_i$ generated by the i output of the D2A converter illustrated in FIG. 5 and a second input terminal connected to a reference voltage value $V_i$.

In an embodiment the second input terminal of the comparator $OA_i$ is connected to the output terminal OUT thus receiving the output voltage which is variable according to the amount of current requested by the load.

The output of the comparator $OA_i$ is connected to the gate terminal of the upper PMOS transistor M2 of the overshoot prevent circuit 12.

Figure 6:
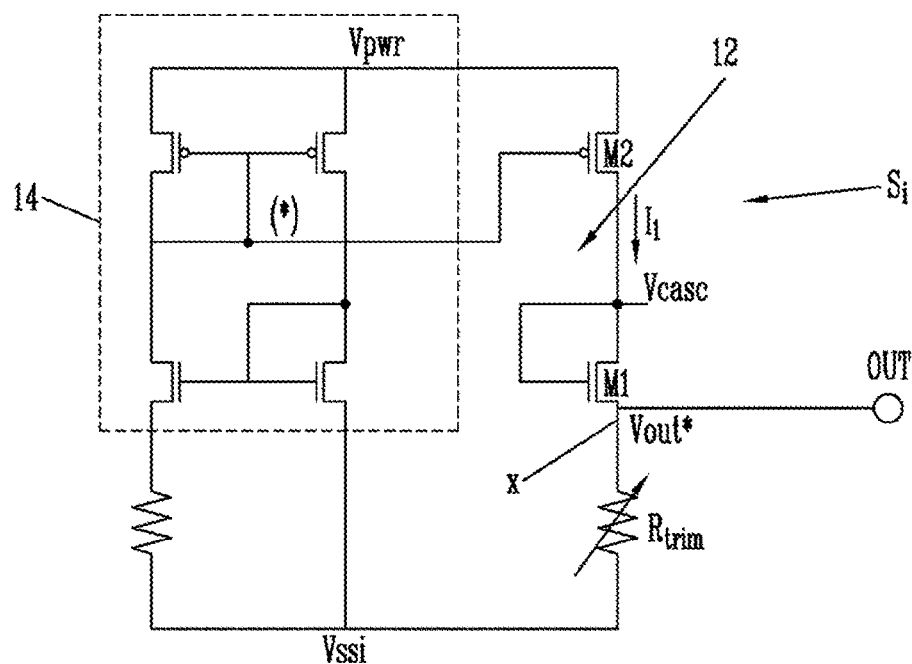
FIG. 6 illustrates a schematic view of a modular portion of the high speed circuit portion according to an embodiment of the present disclosure.

Referring to FIG. 6 it is illustrated in the structure of one single stage $S_i$ that specifically includes the cascade structure 12 to limit the overshoot voltage after recovering from the output voltage drop.

In an embodiment the source terminal of the lower NMOS transistor M1 is connected to the reference voltage Vssi through a variable resistance $R_{trim}$ that will be trimmed to obtain a desired voltage Vcasc according to the following relation:

$$Vcasc = Vout^* + Vthn$$

Where: Vout* is substantially identical to VOUT and Vthn is the threshold of the NMOS transistor M1.

The value of the voltage Vcasc remains therefore fixed by the modulation of the variable resistance $R_{trim}$ that allows obtaining the desired voltage Vout* on the X node since $R_{trim} * I1 = Vout^*$.

Where: I1 is a current output from the drain of the upper PMOS transistor M2.

The structure illustrated in FIG. 6 is substantially insensitive to variations in the voltage power supply or in temperature and/or skew process.

The reason is given by the fact that upper PMOS transistor M2 may be designed in order to select the better dimension of a width of the upper PMOS transistor M2 and thus improving the slew rate and the recovery speed after an output voltage drop.

For example, if we need to recover the drop after a predetermined time interval Δt, fixed, it's possible to design the W of the PMOS transistor M2 of the first stage $S_1$ of the overshoot prevent circuit 12 enable by the first threshold value V1 and so on for the other PMOS transistors of the other stages $S_1, S_2 \ldots$ or $S_n$.

Since the slew rate may be computed through the following relation:

$$\Delta V/\Delta t = I/C$$

where the current I is selected according to the dimension W of the PMOS transistors while the capacitance C is fixed by the circuitry.

Therefore, by varying the width W of the PMOS transistors it is possible to improve the slew rate according to the depth of the output voltage drop.

The other NMOS transistor M1 has been provided to avoid the overshoot on the output terminal OUT that the passive capacitance inside the LDO regulator is not able to control since the feedback network including such a capacitance is too slow.

In view of the cascade configuration of the NMOS transistor M1 such a transistor is kept to its pinch off when the voltage value on the node OUT is equivalent to VREF. In this situation the NMOS transistor M1 is turned off and no current is flowing in the overshoot prevent circuit 12.

The voltage value Vcasc is fixed even when the output voltage VOUT is moving and in this manner the NMOS transistor M1 avoids any overshoot after the voltage drop on the output terminal OUT. When the comparator $OA_i$ enables the PMOS transistor M2 the voltage value on the output terminal node OUT rises up to the value VREF and the threshold voltage on the NMOS transistor M1 goes to zero thus turning off NMOS transistor M1.

The FIGS. from 7 to 10 illustrate the high speed circuit portion of in different operating conditions that will disclose hereinafter.

Figure 7:
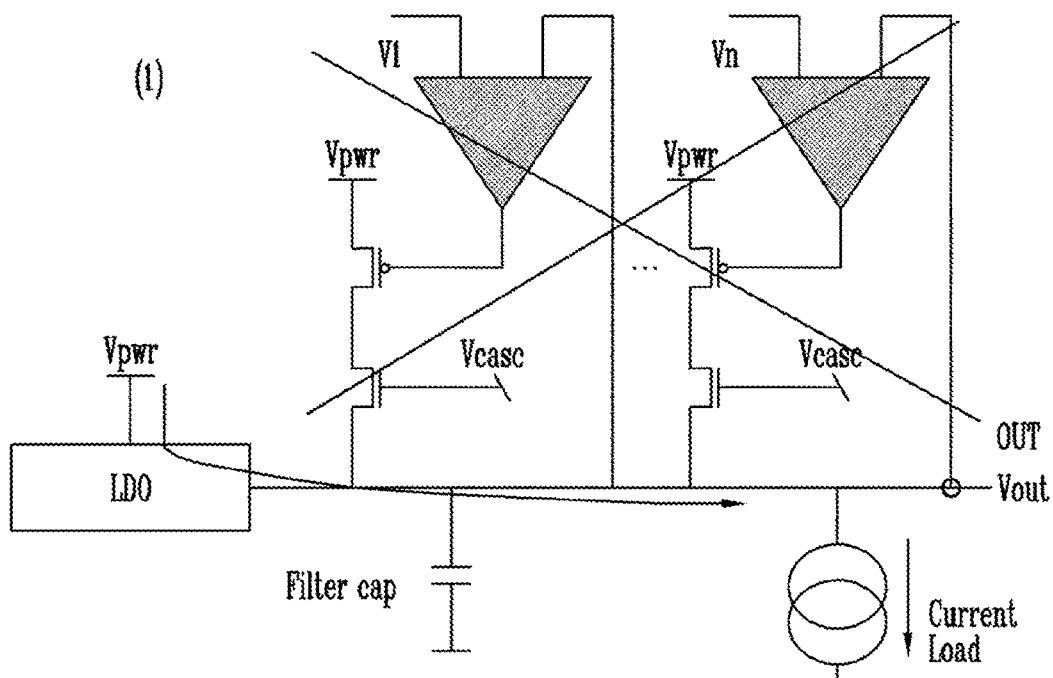

Referring to FIG. 7 it is illustrated a first (1) situation wherein there is substantially no voltage drop on the output voltage node OUT, when there is a low load current.

In such a condition the LDO regulator is able to supply the required current to the load and the voltage output value Vout remains substantially constant. No stage $S_i$ is asked to offer a contribution to recover the voltage drop since there is no voltage drop, as indicated by the 'X'.

Figure 1:
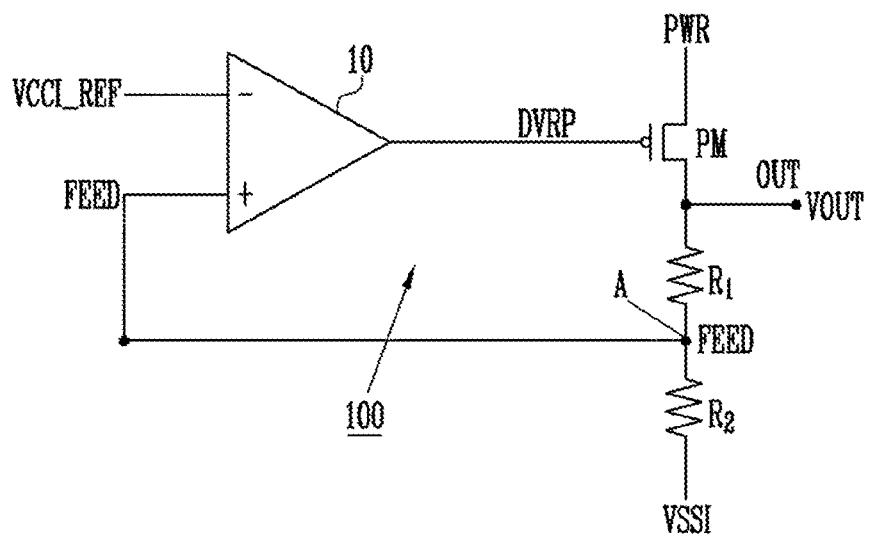
FIG. 1 schematically illustrates a circuit diagram of a conventional LDO regulator.
Figure 2:
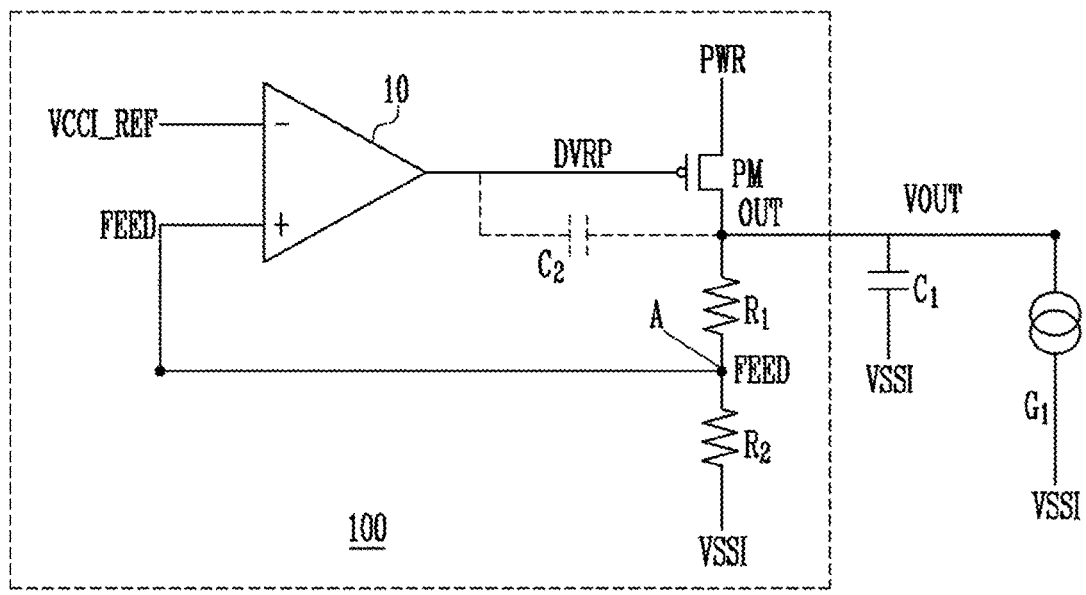
FIG. 2 schematically illustrates a circuit diagram of the LDO regulator of FIG. 1 connected to a load requiring a current peak.
Figure 3:
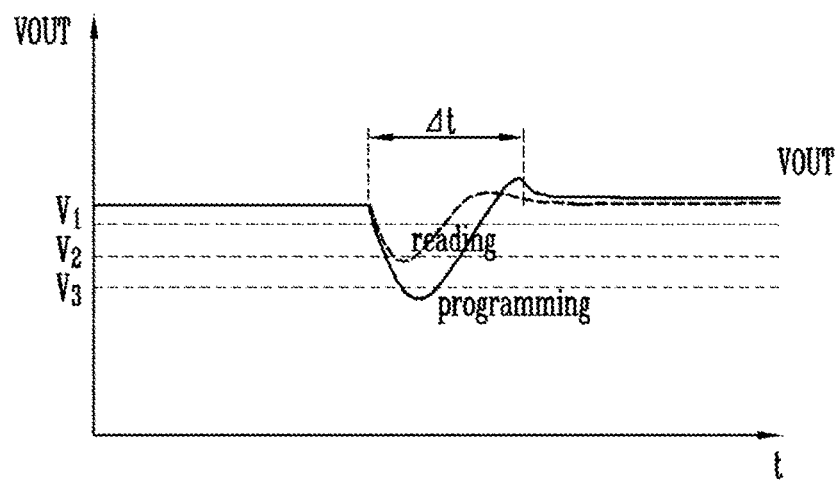
FIG. 3 illustrates a diagram of the voltage output versus time of a LDO regulator when a high amount of current is suddenly requested by a load and an important voltage drop is generated at the output node of the voltage regulator.
Figure 8:
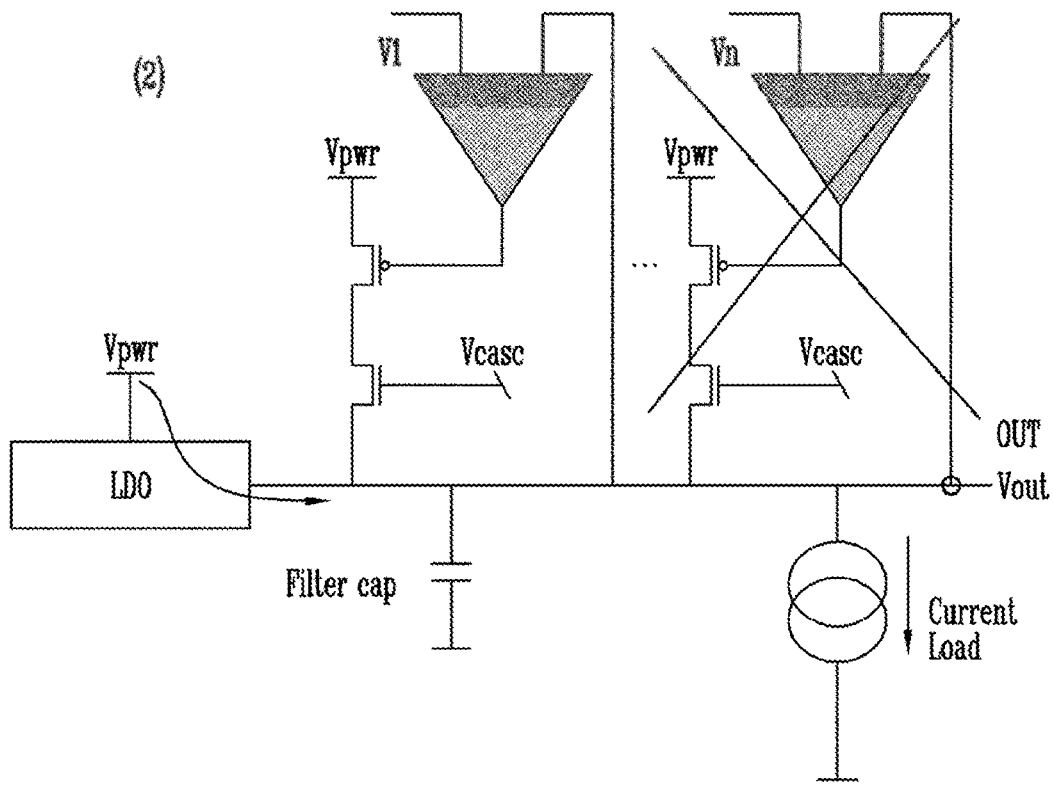

In a second situation (2) illustrated in FIG. 8 the load starts requesting more current and this may cause a voltage drop on the output voltage node OUT of the LDO regulator, as illustrated in FIG. 3.

According to the depth of such a voltage drop ($V_1$, $V_2$ or $V_3$) it might be necessary that one or more of the compensation stages $S_1$, $S_2$ . . . or $S_n$ could be enabled or activated by its corresponding comparator ($OA_i$) in order generate an extra current that is summed in the output node OUT to the current provided by the LDO regulator.

Figure 9:
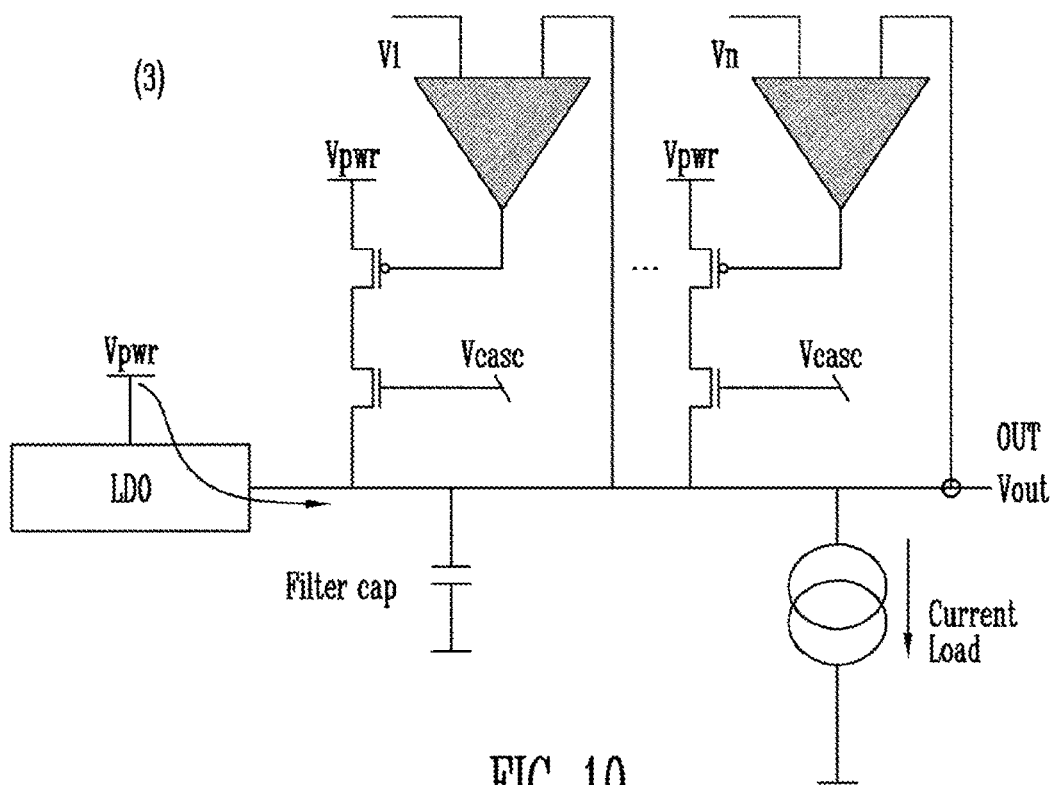

In the third example (3) illustrated in FIG. 9 all the compensation stages $S_1$, $S_2$ . . . and $S_n$ have been enabled in parallel and in view of the amount of load current required by the load.

Figure 10:
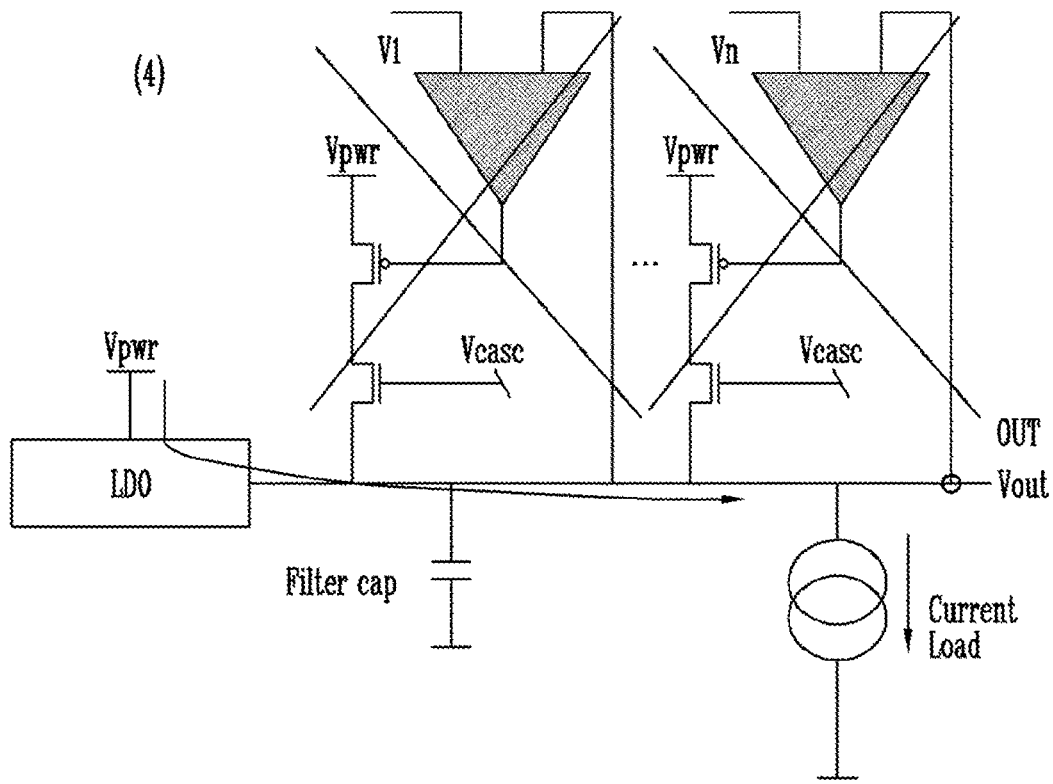

In the final example (4) reported in FIG. 10 it is illustrated a situation wherein the voltage output has returned to a regular VOUT value after the voltage drop with a low load current and with a very small overshoot since the cascade structure of the stages $S_1$, $S_2$ . . . or $S_n$, limits any voltage ringing, as well illustrated in FIG. 11, see 'X'.

Referring to FIG. 11 it is illustrated the behavior of the circuit portion according to an embodiment that helps the LDO regulator to face the problems of a voltage drop improving the slew-rate and the recovery of the voltage output of the LDO regulator.

The high speed circuit portion of the various embodiments may solve the technical problem and may achieve a great number of advantages hereinafter listed.

The configuration of the compensation stages $S_1$, $S_2$ . . . or $S_n$ is very flexible and the voltage values corresponding to the depth of the output voltage drop may be obtained through the look-up table 15 taking into account different aspects such as:

Temperature: having a digital temperature sensor in the memory device it may be possible to optimize the threshold levels to compensate the voltage drop;

Process skew: the use of the variable resistance in each stage may allow to trim the circuit over process variation;

Working Operations and address insensitive: the comparators thresholds may be set to increase performances in function of the algorithm and operation address;

Power consumptions specific: low power consumption in an idle state;

Timing requirements: the number of enabled stages may be set to achieve the best drop recovery obtaining an adaptive working operation in a function of peak current load.

Moreover, the LDO structure may be designed with low design effort since it may be selected for an LDO regulator calibrated on the minimum requirement in terms of an amount of current to be fed.

A further advantage is given by the selection of an independent LDO topology since the proposed method works with any type of LDO architecture. In this respect, it may be suitable to adopt an LDO output driver with a smaller Miller capacitor since the recovery effort after an output voltage drop is dependent on the compensation stages connected to the LDO output.

The circuit portion device and/or methods as discussed above are particular useful in the design of memory devices, processors, and computer systems. For example, referring to FIG. 12, a block diagram of a system employing a circuit portion device and/or method in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one circuit portion device and/or method as discussed above. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one circuit portion device and/or method as discussed above, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a system 1000 employing a circuit portion device and/or method as discussed above. In alternate embodiments, such as, for example but not limited to, cellular phones or digital cameras, the components may differ from the embodiments illustrated in FIG. 12.

What is claimed is:

1. A voltage compensation circuit comprising:
   a regulator outputting an output voltage to an output terminal; and
   a plurality of stages connected in parallel to the output terminal and controlling the output voltage in response to predetermined threshold voltages and the output voltage,
   wherein the stages compare the predetermined threshold voltages with the output voltage and output voltages to the output terminal,
   wherein each of the plurality of stages includes:
   a comparator comparing one of the predetermined threshold voltages with the output voltage and outputting a first voltage; and
   an overshoot prevent circuit including a PMOS transistor and an NMOS transistor, which are coupled between a reference voltage node and the output terminal, transmitting a reference voltage to the output terminal in response to the first voltage which is varied by the comparator and a second voltage which is fixed irrespective of the output voltage, and
   wherein the PMOS transistor operates in response to the first voltage, and the NMOS transistor operates in response to the second voltage.

2. The voltage compensation circuit of claim 1, wherein the predetermined threshold voltages are obtained from a digital-to-analog converter which receives digital values related to an operation performed on the memory device and a supply voltage.

3. The voltage compensation circuit of claim 2, wherein the digital values correspond to different amounts of load current needed by a load in different working conditions or environmental situations.

4. The voltage compensation circuit of claim 1, wherein a load is a memory matrix or an associated peripheral circuitry of the memory device.

5. The voltage compensation circuit of claim 2, wherein the digital-to-analog converter outputs the predetermined threshold voltages by different digital values of a look-up table.

6. The voltage compensation circuit of claim 5, wherein the different digital values are stored in the look-up table and are correlated to the operation performed on the memory device.

7. The voltage compensation circuit of claim 1, wherein a dimension of a width of the PMOS transistor of each of the stages is selected according to a required recovery time of the output terminal when a voltage drop of the output terminal is generated.

* * * * *